US012745455B2

(12) United States Patent
Pons et al.

(10) Patent No.: US 12,745,455 B2
(45) Date of Patent: Sep. 22, 2026

(54) SEMICONDUCTOR FABRICATION PROCESS

(71) Applicant: X-FAB France SAS, Corbeil-Essonnes (FR)

(72) Inventors: Nicolas Pons, Corbeil-Essonnes (FR); Rui Zhu, Corbeil-Essonnes (FR); Aude Berbezier, Corbeil-Essonnes (FR); Raphael Lachaume, Corbeil-Essonnes (FR); Brice Grandchamp, Corbeil-Essonnes (FR); Gregory U'Ren, Corbeil-Essonnes (FR)

(73) Assignee: X-FAB FRANCE SAS, Corbeil-Essonnes (FR)

( * ) Notice: Subject to any disclaimer, the term of this patent is extended or adjusted under 35 U.S.C. 154(b) by 512 days.

(21) Appl. No.: 18/198,549

(22) Filed: May 17, 2023

(65) Prior Publication Data

US 2023/0378002 A1 Nov. 23, 2023

(30) Foreign Application Priority Data

May 18, 2022 (FR) ........................................ 2204715
Sep. 28, 2022 (GB) ........................................ 2214188

(51) Int. Cl.
*H10D 86/01* (2026.01)
*H10D 84/01* (2026.01)
(Continued)

(52) U.S. Cl.
CPC ............. *H10D 86/01* (2025.01); *H10D 87/00* (2025.01); *H10P 90/1906* (2026.01);
(Continued)

(58) Field of Classification Search
CPC .... H10D 86/01; H10D 87/00; H10D 84/0109; H10D 84/038; H01L 21/76281;
(Continued)

(56) References Cited

U.S. PATENT DOCUMENTS 6,232,649 B1 5/2001 Lee
6,331,470 B1 * 12/2001 Sanfilippo ......... H01L 21/76264 438/362
(Continued)

FOREIGN PATENT DOCUMENTS

JP 2007042760 2/2001

OTHER PUBLICATIONS

French Republic: Preliminary Search Report issued Dec. 15, 2022 which pertains to French Patent Application No. 2204715. 7 pages.
(Continued)

*Primary Examiner* — Richard A Booth
(74) *Attorney, Agent, or Firm* — Thompson Hine LLP

(57) ABSTRACT

A method of making a semiconductor structure, the method including providing a silicon on insulator (SOI) substrate having a first epitaxial layer and a bulk silicon substrate separated by a buried oxide layer. The method further includes performing a local oxidation of silicon (LOCOS) process in a region of the SOI substrate to at least partially oxidize the first epitaxial silicon layer in the region, and locally etching the SOI substrate in the region to create a trench through the buried oxide layer and to the bulk silicon substrate. The method further includes forming a second epitaxial layer on the bulk silicon substrate in the trench, and forming one or more semiconductor devices in the first and second epitaxial layers.

14 Claims, 12 Drawing Sheets

(51) Int. Cl.

| | |
|---|---|
| ***H10D 84/03*** | (2025.01) |
| ***H10D 87/00*** | (2026.01) |
| ***H10P 50/28*** | (2026.01) |
| ***H10P 90/00*** | (2026.01) |
| ***H10W 10/00*** | (2026.01) |
| ***H10W 10/10*** | (2026.01) |
| ***H10W 10/13*** | (2026.01) |
| ***H10W 10/17*** | (2026.01) |

(52) U.S. Cl.
CPC ....... *H10W 10/012* (2026.01); *H10W 10/014* (2026.01); *H10W 10/061* (2026.01); *H10W 10/13* (2026.01); *H10W 10/17* (2026.01); *H10W 10/181* (2026.01); *H10D 84/0109* (2025.01); *H10D 84/038* (2025.01); *H10P 50/283* (2026.01)

(58) Field of Classification Search
CPC ........ H01L 21/76283; H01L 21/31116; H10W 10/014; H10W 10/17; H10W 10/181; H10W 10/012; H10W 10/061; H10W 10/13; H10P 90/1906
See application file for complete search history.

(56) References Cited

U.S. PATENT DOCUMENTS

| | | | | |
|---|---|---|---|---|
| 7,018,904 | B2 | 3/2006 | Yamada et al. | |
| 7,339,254 | B1 | 3/2008 | Kempf | |
| 7,595,232 | B2 | 9/2009 | Kim et al. | |
| 8,716,750 | B2 * | 5/2014 | Liao | H10D 62/021 257/190 |
| 9,112,057 | B1 * | 8/2015 | Pradhan | H10D 84/08 |
| 10,192,886 | B2 | 1/2019 | Verma et al. | |
| 2003/0104658 | A1 | 6/2003 | Furukawa et al. | |
| 2005/0277260 | A1 | 12/2005 | Cohen et al. | |
| 2008/0124847 | A1 | 5/2008 | Sudo | |
| 2013/0221412 | A1 | 8/2013 | Bian et al. | |
| 2016/0225768 | A1 * | 8/2016 | Cheng | H10D 84/08 |
| 2017/0005111 | A1 | 1/2017 | Verma et al. | |
| 2019/0273028 | A1 | 9/2019 | Jain et al. | |
| 2019/0333965 | A1 | 10/2019 | Campanella-Pineda et al. | |

OTHER PUBLICATIONS

Great Britain IP Office: Search/Examination Report issued Mar. 28, 2023 which pertains to Great Britain Patent Application No. GB2214188. 1. 4 pages.

* cited by examiner

SEMICONDUCTOR FABRICATION PROCESS

This application claims priority to French Patent Application No. 2204715 filed on May 18, 2022 and United Kingdom Patent Application No. 2214188.1, filed on Sep. 28, 2022. The entire contents of both of these applications are hereby incorporated by reference.

TECHNICAL FIELD

The present disclosure relates to a semiconductor fabrication process, and in particular a process comprising a silicon on insulator (SOI) substrate.

BACKGROUND

Silicon on insulator (SOI) technology can provide many advantages compared to bulk silicon technology due to the improved device isolation provided by the buried oxide (BOX) layer.

Complementary metal oxide semiconductor (CMOS) technology such as field effect transistors (FETs) can be used to form radio frequency (RF) devices such as low noise amplifiers (LNA). Such devices can be formed on a silicon on insulator (SOI) substrate for improved isolation. RF-SOI is the dominant technology for RF-front-end applications in RF mobile, where the application frequencies are <6 GHz.

However, for high frequency (e.g. >6 GHz) applications, a bipolar junction transistor (BJT) such as an NPN transistor may be used instead of a NFET. For example, a SiGe hetero bipolar transistor (HBT) outperforms Si N-MOS transistors with respect to the maximum transit frequency (Ft) and the minimum noise figure (NFmin). A BJT may be implemented together with CMOS technology on bulk Si, which is referred to as BiCMOS.

The BiCMOS technology has had modest success in niche applications and is still developing.

SUMMARY

The present disclosure provides a method of forming a semiconductor structure as set out in the appended claims.

BRIEF DESCRIPTION OF THE DRAWINGS

Specific embodiments of the method will now be described with reference to the accompanying drawings.

DETAILED DESCRIPTION

Figure 1:
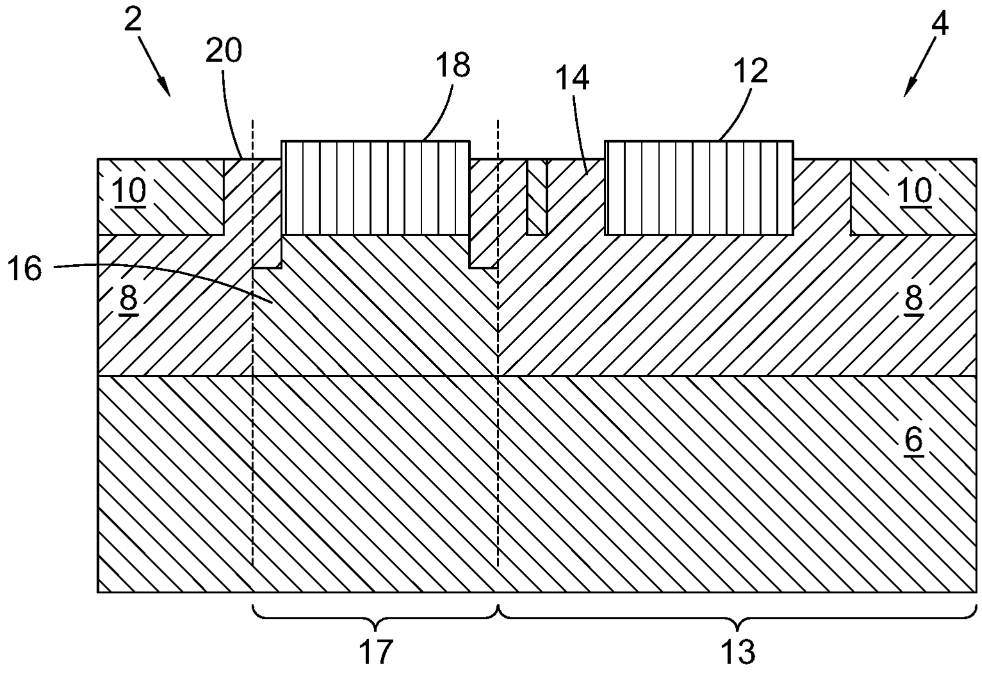
FIG. 1 shows a schematic diagram of a cross section of a semiconductor structure according to an embodiment.

FIG. 1 shows a schematic cross-section of a semiconductor structure 2 (e.g. a part of a low noise amplifier, LNA) according to an embodiment. The semiconductor structure 2 comprises a SOI substrate 4 comprising a bulk silicon substrate 6 (also referred to as a "silicon handling wafer"), a buried oxide (BOX) layer 8 and an epitaxial silicon layer 10. The epitaxial layer 10 is the active layer in which semiconductor devices such as transistors, diodes and/or resistors are formed.

A complementary metal oxide semiconductor (CMOS) device 12 is formed in the epitaxial layer 10 in a CMOS device region 13 above the BOX layer 8 and surrounded by isolation 14. The CMOS device 12 may be a 1.2 V or 2.5 V CMOS device for example. A trench 16 is located in a bulk region 17 in the substrate 4 and goes through the epitaxial layer 10 and the BOX layer 8 to reach the underlying bulk silicon 6. The trench 16 is filled with (substantially) monocrystalline silicon (also referred to as "epitaxial silicon" in this disclosure). The bulk region 17 is defined by the trench 16 and is directly adjacent to and in contact with the CMOS device region 13. A bipolar junction transistor (BJT) 18 (e.g. a SiGe or SiGeC heterojunction bipolar transistor, HBT) is formed in or on the monocrystalline silicon in the trench 16. The BJT 18 is substantially level with the CMOS device 12 (i.e. they are located at substantially the same height in the substrate 4). The monocrystalline silicon in the trench 16 connects the BJT 18 directly to the bulk silicon layer 6 without intervening oxide. This can significantly improve the heat conduction/dissipation from the HBT 18. The HBT 18 is at least partially surrounded by isolation material 20, in one case being thermally grown silicon oxide ($SiO_2$). The structure 2 also comprises a plurality of metal layers (not shown) on the substrate 4 for electrically connecting to the CMOS device 12 and the BJT 18. Typically the structure 2 would comprise at least four metal layers (three thin layers and one thick topmost layer) made from copper.

The BOX layer 8 can have a thickness of about 1000 nm, while the epitaxial layer 10 above it can have a thickness of about 150 nm for example. The resistivity of the epitaxial silicon layer may be about 20 Ω-cm, while the handling wafer 6 has a higher resistivity of about 3 kΩ-cm. The epitaxial silicon in the trench 16 can have a very low resistance of only about 0.5 Ω-cm (typically achieved by doping).

Figure 2A:
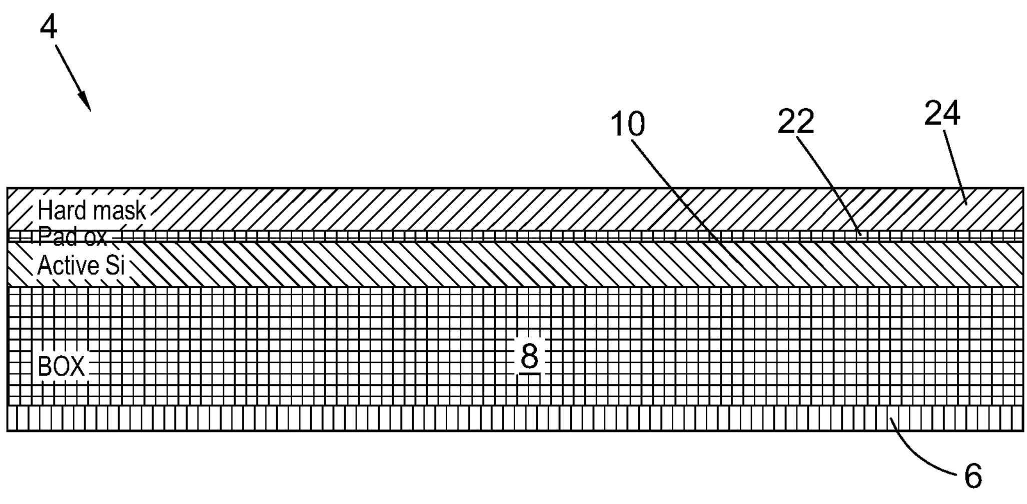
FIG. 2A shows a schematic diagram of a cross section of a substrate in a first step of forming a semiconductor structure according to an embodiment.
Figure 2B:
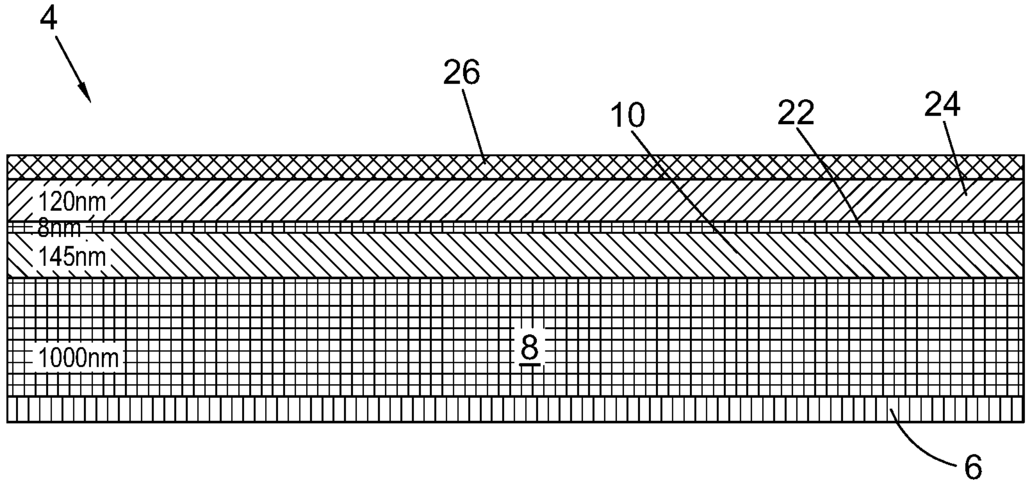
FIG. 2B shows a schematic diagram of a cross section of a substrate in a second step of forming a semiconductor structure according to an embodiment.
Figure 2C:
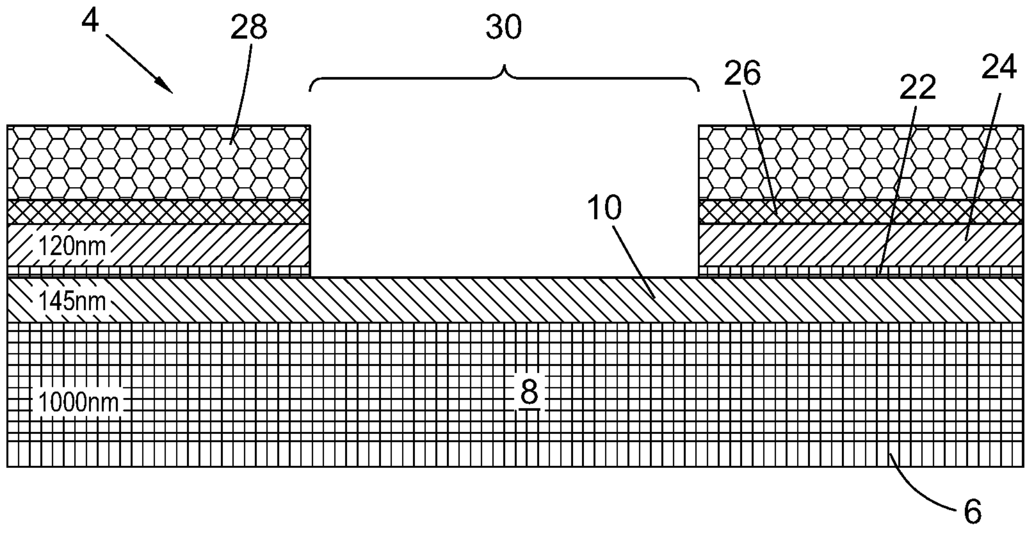
FIG. 2C shows a schematic diagram of a cross section of a substrate in a third step of forming a semiconductor structure according to an embodiment.
Figure 2D:
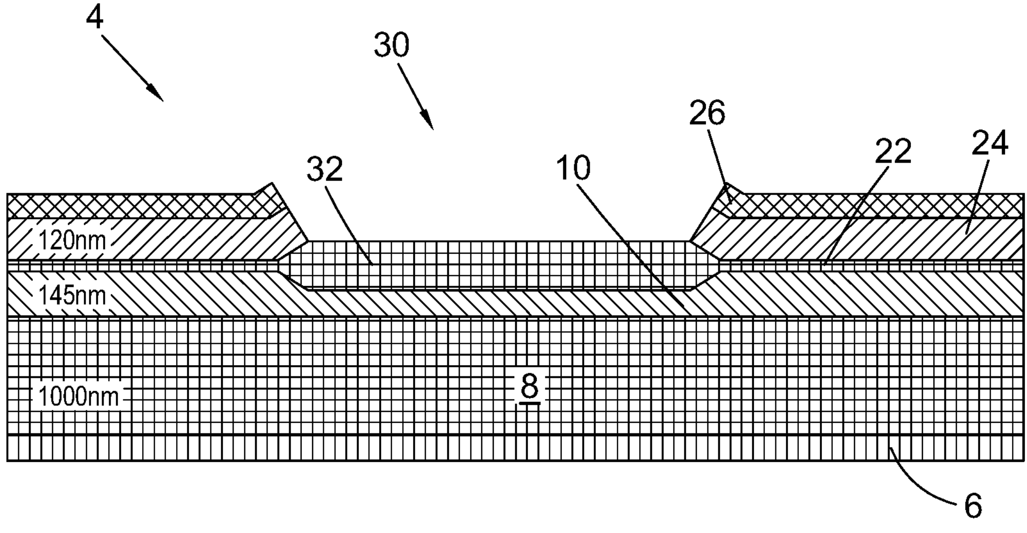
FIG. 2D shows a schematic diagram of a cross section of a substrate in a fourth step of forming a semiconductor structure according to an embodiment.
Figure 2E:
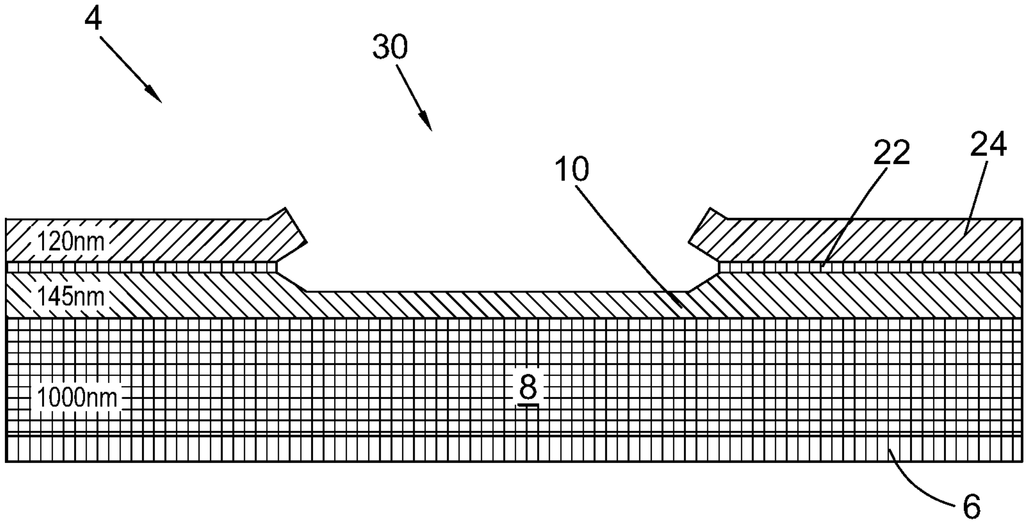
FIG. 2E shows a schematic diagram of a cross section of a substrate in a fifth step of forming a semiconductor structure according to an embodiment.
Figure 2F:
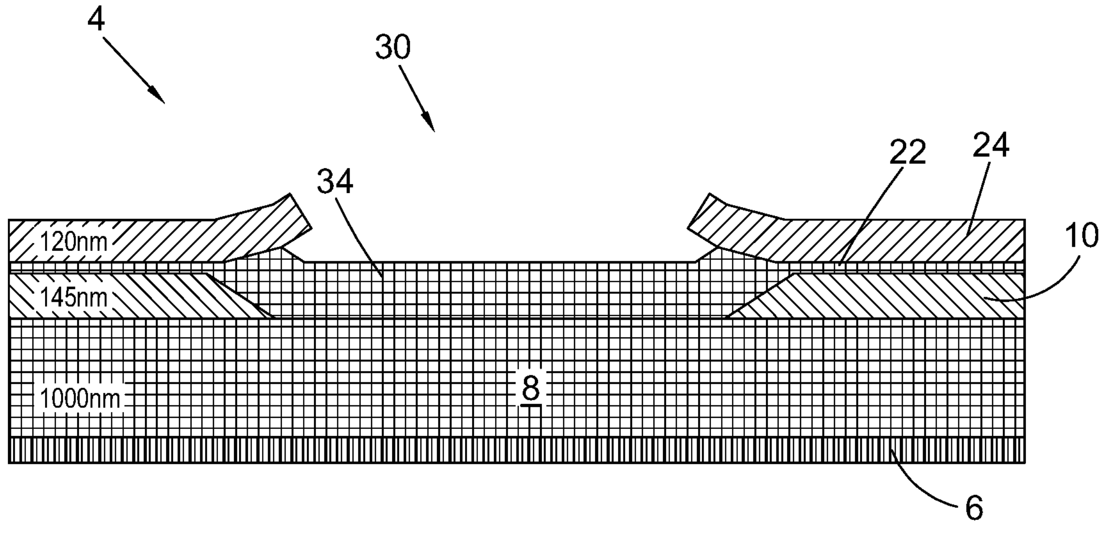
FIG. 2F shows a schematic diagram of a cross section of a substrate in a sixth step of forming a semiconductor structure according to an embodiment.
Figure 2G:
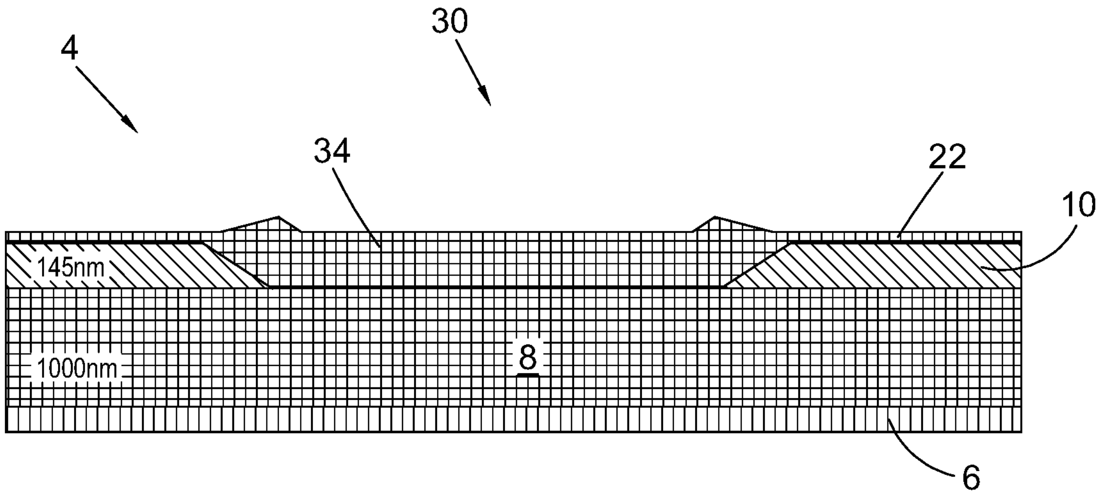
FIG. 2G shows a schematic diagram of a cross section of a substrate in a seventh step of forming a semiconductor structure according to an embodiment.
Figure 2H:
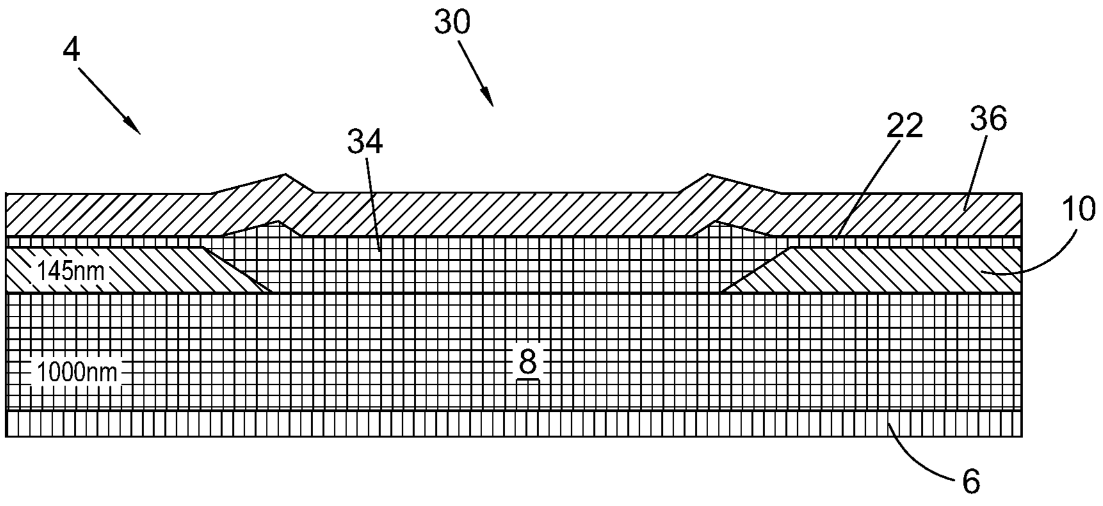
FIG. 2H shows a schematic diagram of a cross section of a substrate in an eighth step of forming a semiconductor structure according to an embodiment.
Figure 2I:
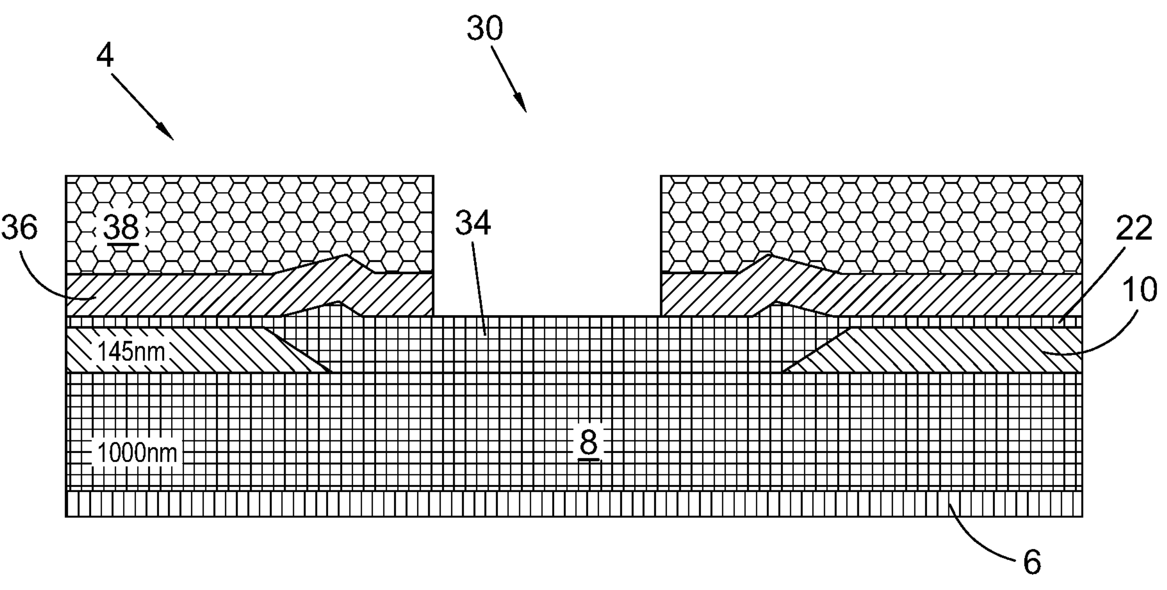
FIG. 2I shows a schematic diagram of a cross section of a substrate in a ninth step of forming a semiconductor structure according to an embodiment.
Figure 2J:
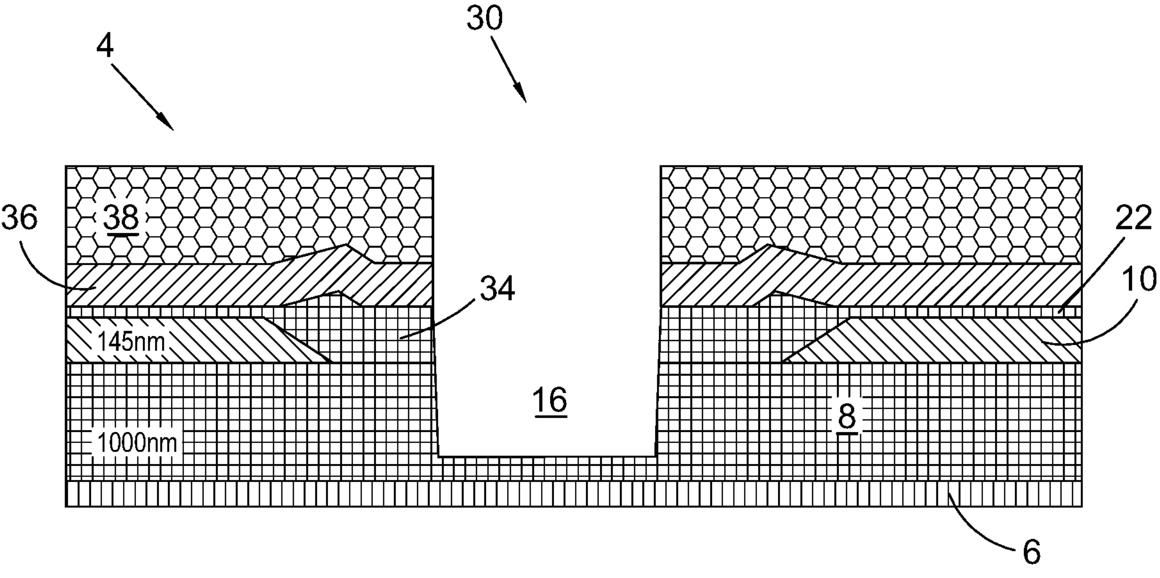
FIG. 2J shows a schematic diagram of a cross section of a substrate in a tenth step of forming a semiconductor structure according to an embodiment.
Figure 2K:
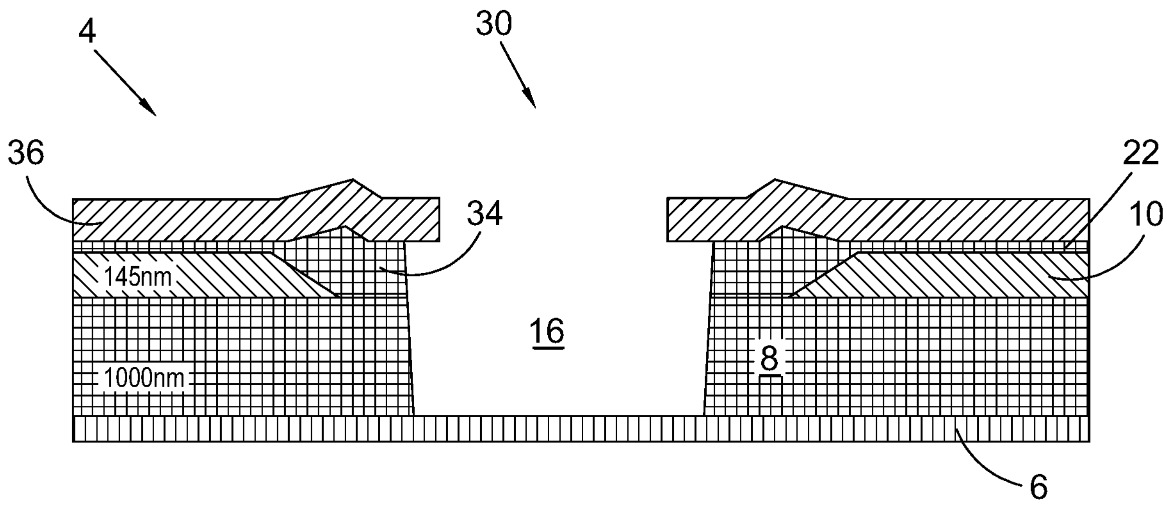
FIG. 2K shows a schematic diagram of a cross section of a substrate in an eleventh step of forming a semiconductor structure according to an embodiment.
Figure 2L:
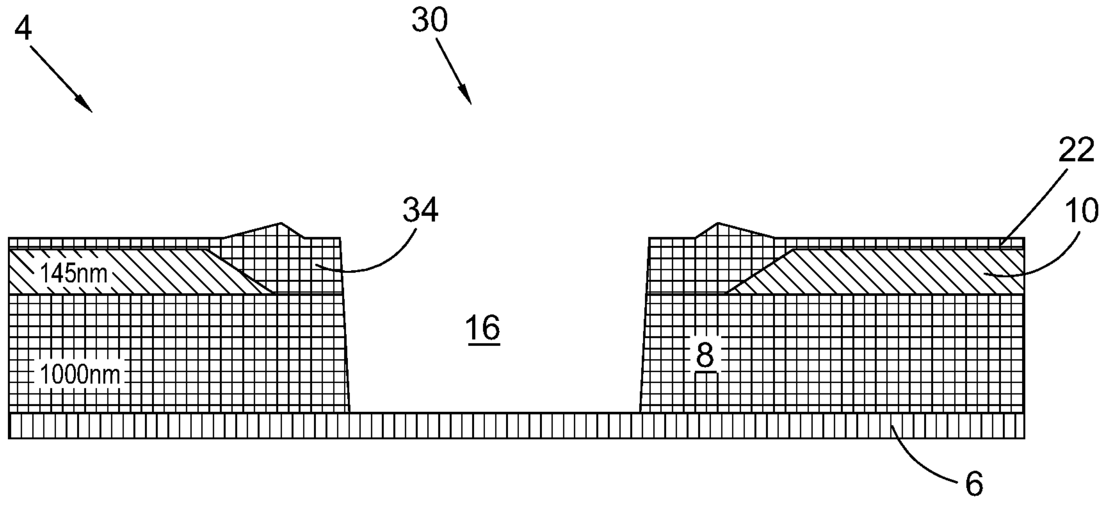
FIG. 2L shows a schematic diagram of a cross section of a substrate in a twelfth step of forming a semiconductor structure according to an embodiment.
Figure 2M:
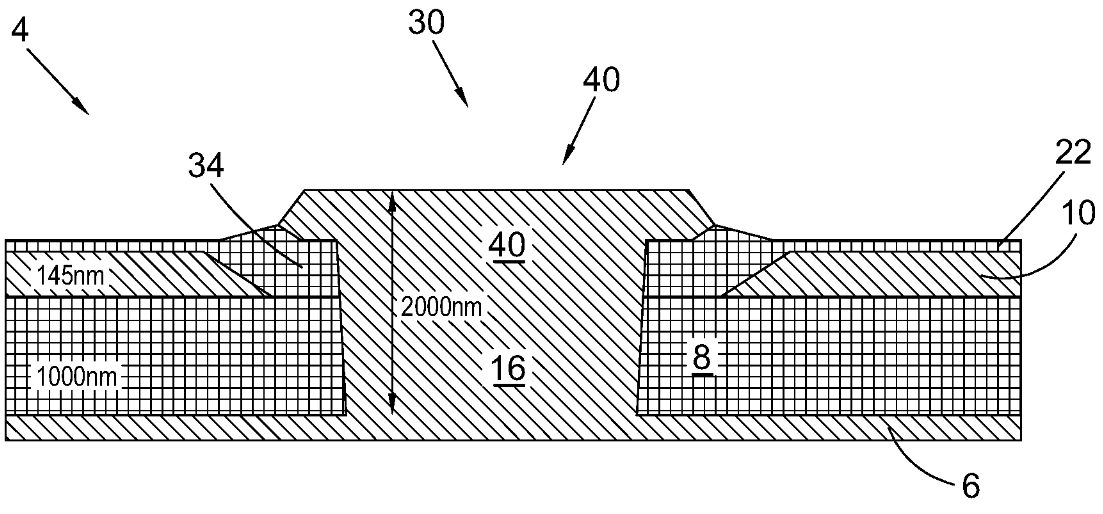
FIG. 2M shows a schematic diagram of a cross section of a substrate in a thirteenth step of forming a semiconductor structure according to an embodiment.
Figure 2N:
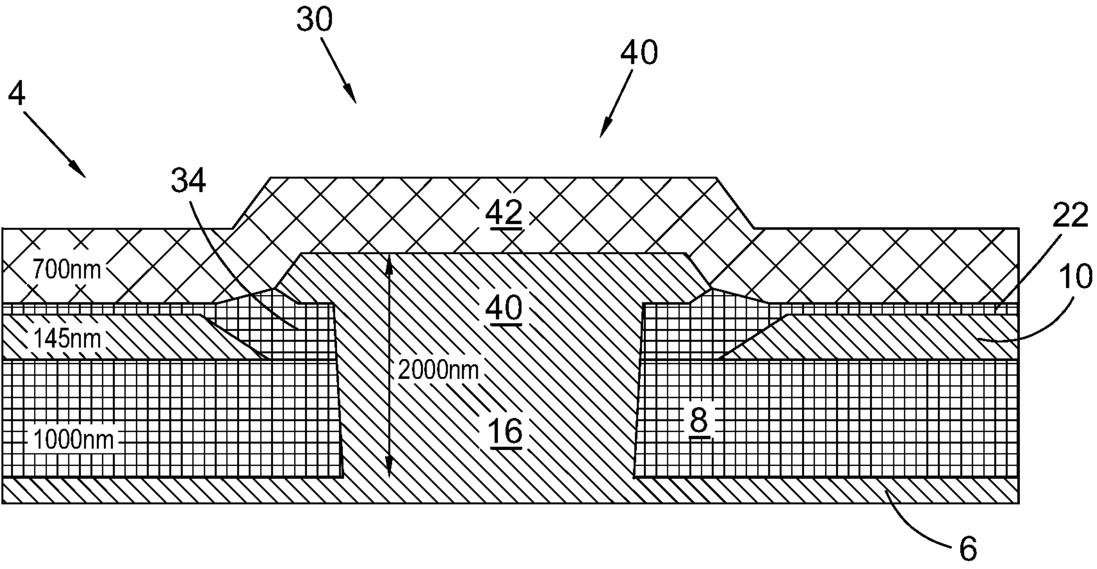
FIG. 2N shows a schematic diagram of a cross section of a substrate in a fourteenth step of forming a semiconductor structure according to an embodiment.
Figure 2O:
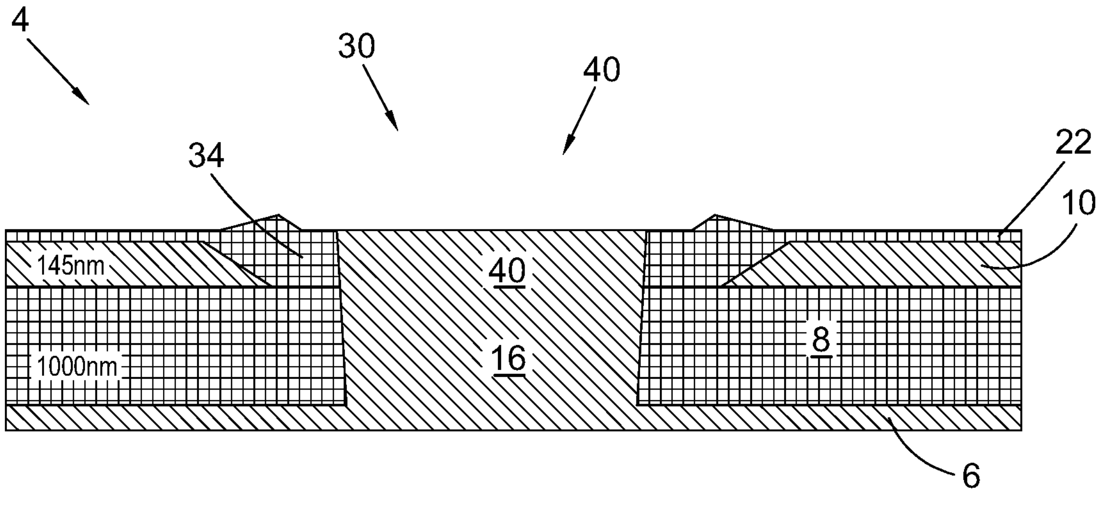
FIG. 2O shows a schematic diagram of a cross section of a substrate in a fifteenth step of forming a semiconductor structure according to an embodiment.
Figure 2P:
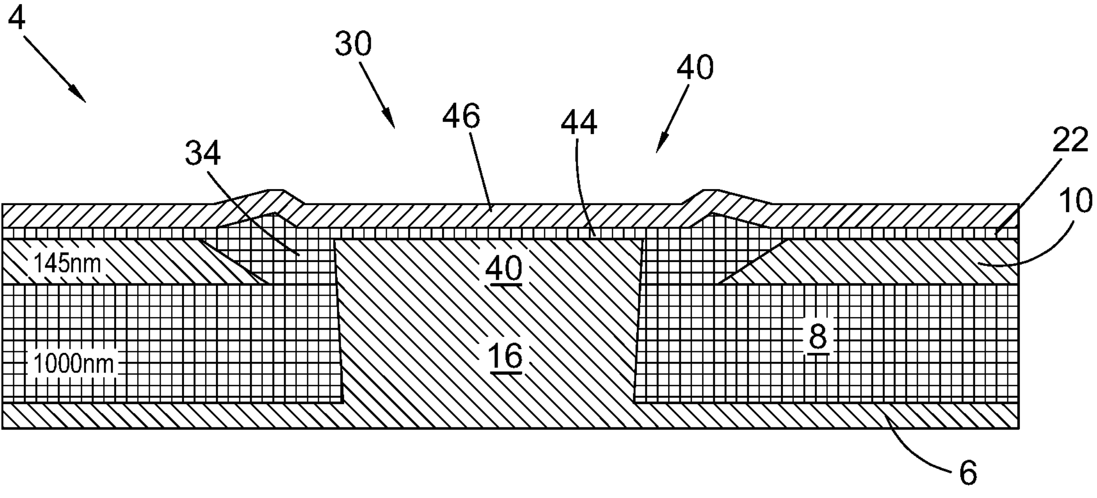
FIG. 2P shows a schematic diagram of a cross section of a substrate in a sixteenth step of forming a semiconductor structure according to an embodiment.
Figure 2Q:
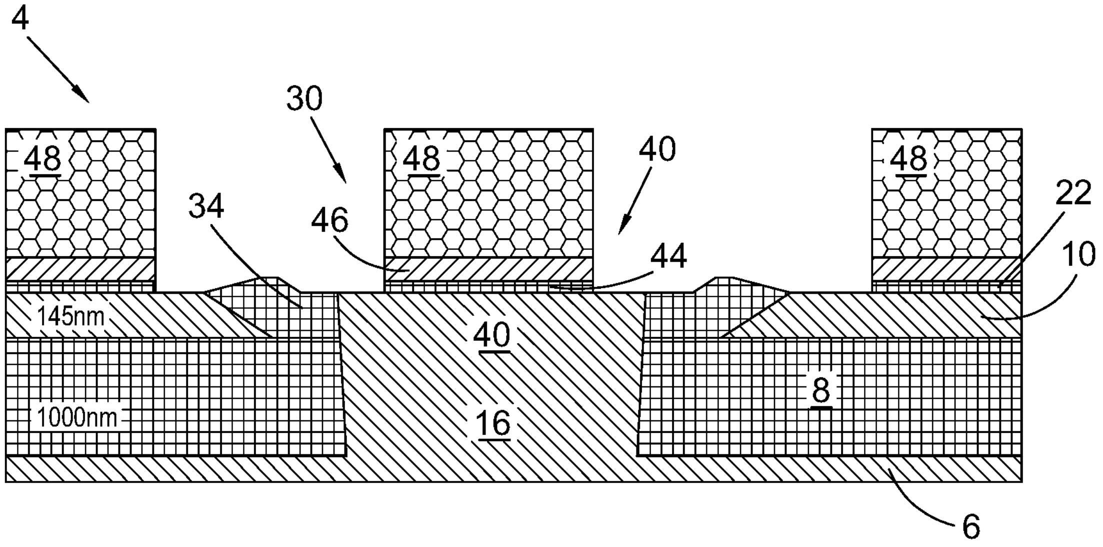
FIG. 2Q shows a schematic diagram of a cross section of a substrate in a seventeenth step of forming a semiconductor structure according to an embodiment.
Figure 2R:
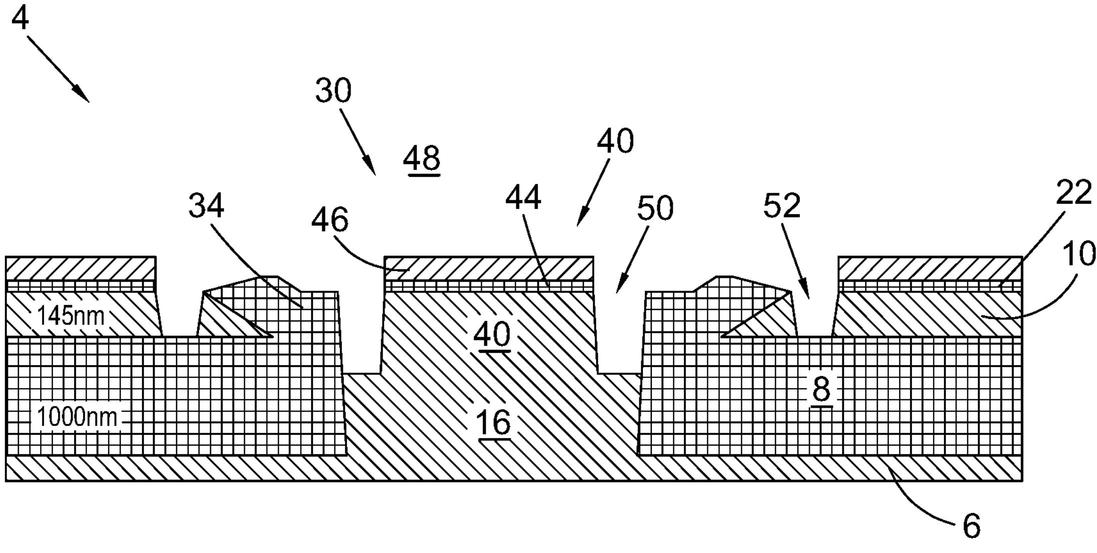
FIG. 2R shows a schematic diagram of a cross section of a substrate in an eighteenth step of forming a semiconductor structure according to an embodiment.
Figure 2S:
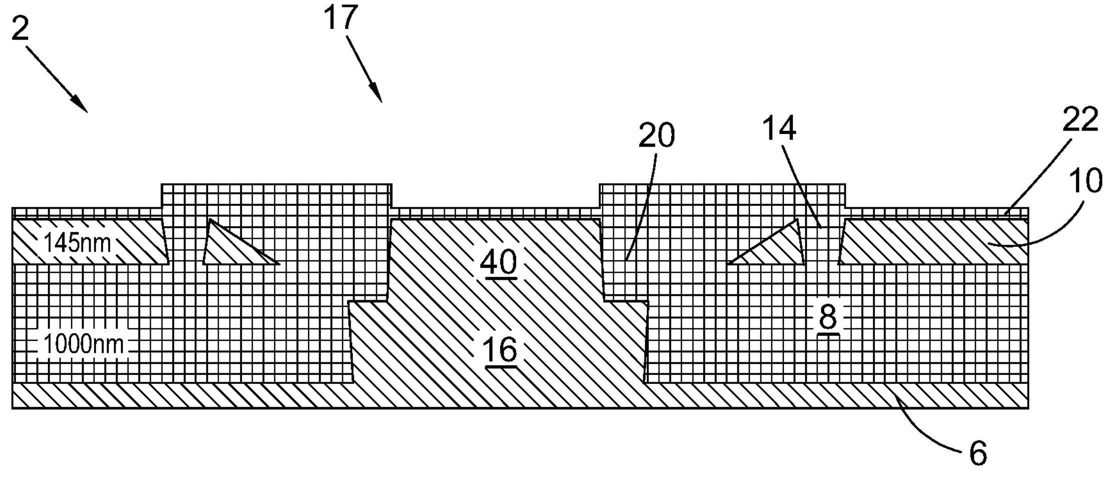
FIG. 2S shows a schematic diagram of a cross section of a substrate in a nineteenth step of forming a semiconductor structure according to an embodiment.

FIGS. 2A to 2S are schematic diagrams illustrating the steps of a method of forming a semiconductor structure 2 according to an embodiment. The structure 2 formed may be the structure 2 illustrated in FIG. 1. The same reference numerals have been used in different Figures for equivalent or similar features to aid understanding and are not intended to limit the illustrated embodiments.

FIG. 2A shows a SOI substrate 4 comprising a silicon handling wafer 6, a BOX layer 8 and an epitaxial silicon layer 10. On the substrate 4 is a pad oxide layer 22 and a nitride hard mask layer 24. The pad oxide layer 22 is a thermal oxide and may have a thickness of about 8 nm and the nitride hard mask layer 24 may have a thickness of about 120 nm.

FIG. 2B shows the SOI substrate 4 after depositing an oxide layer 26. Typically, the oxide is deposited by low pressure chemical vapor deposition (LPCVD).

FIG. 2C shows the structure after depositing a photoresist 28, developing the photoresist 28 to define a trench region 30, etching the nitride hard mask 24 (mask open) in the trench region 30. The deposited oxide 26 and the pad oxide 22 are removed from the trench region 30 to expose the underlying silicon layer 10. The step of removing the oxides is typically performed at the same time as opening the mask 24 (i.e. in the same etch step).

FIG. 2D shows the structure after stripping the photoresist 28 and a thermal oxidation step comprising a so called local oxidation of silicon (LOCOS) process. The thickness of the thermal oxide 32 in the trench region 30 is increased. Importantly, shallow trench isolation (STI) is not used at this stage to provide silicon oxide. The oxide 32 formed in the trench region 30 has a typical LOCOS shape with flat top and bottom surfaces and tapered ends, and with about half the cross section located above the surface of the epitaxial silicon layer 10 on either side.

FIG. 2E shows the structure after an oxide wet etch to remove the oxide in the trench region 30. The epitaxial silicon layer 10 is exposed in the trench region 30. The epitaxial silicon layer 10 is thinner in the trench region 30 due to the previous step of oxidation.

FIG. 2F shows the structure after a further step of thermal oxidation to form a new oxide layer 34 over the BOX layer 8, however there may be no physical transition between the two oxide layers (i.e. the oxide located in the trench region can be substantially homogenous). Applying a second LOCOS process allows the oxide layer in the trench region 30 to grow through the epitaxial silicon layer 10 and to the BOX layer 8. In the trench region 30, there is oxide from the surface to the bulk silicon layer 6. The ends of the epitaxial silicon layer 10 on either side of the trench region 30 are tapered towards the trench region 30. A step of wet deglazing may be performed before the thermal oxidation to avoid oxide formation on the nitride hard mask 24.

FIG. 2G shows the structure after a nitride strip to remove the nitride hard mask 24. A previous step of deglazing can avoid or reduce oxide formation on top of the hard mask 24 and thereby prevent surface defects after stripping the nitride.

FIG. 2H shows the structure after a step of nitride deposition to form nitride layer 36 on the pad oxide layer 22 and on the oxide layer 34 in the trench region 30. The nitride layer 36 can be used as a second hard mask.

FIG. 2I shows the structure after depositing and developing a (second) photoresist 38 and opening the hard mask (nitride layer 36) in the trench region 30. The nitride layer 36 comprises a gap in the trench region 30, which exposes the oxide layer 34.

FIG. 2J shows the structure after a step of dry etching. The step is configured to etch through the oxide layer 34 and at least partly through the BOX layer 8. The dry etch removes oxide in the region defined by the photoresist 38 nitride hard mask 36, thereby forming a trench 16 in the oxide.

FIG. 2K shows the structure after stripping the photoresist 36 and a wet etch step. The wet etch selectively removes oxide in the trench region 30 and exposes the underlying bulk silicon layer 6. The wet etch also broadens the trench 16 in the oxide.

FIG. 2L shows the structure after a nitride strip to remove the nitride layer 36 and to expose the pad oxide 22.

FIG. 2M shows the structure after filling the trench 16 with silicon 40. Silicon 40 is epitaxially grown in the trench 16 on the bulk silicon substrate 6. The silicon 40 in the trench 16 is isolated from the epitaxial silicon layer 10 by the oxide layer 34 formed in the earlier LOCOS steps. The epitaxial silicon 40 in the trench 16 has a thickness/depth at least equal to the combined thickness of the BOX layer 8 and the epitaxial silicon layer 10. Typically, the epitaxial silicon 40 is formed to have greater thickness (e.g. about 2000 nm) so that it extends above the pad oxide layer 22. Typically, the epitaxial silicon 40 is doped during the epitaxy process to reduce resistivity. For example, the epitaxial silicon 40 may be slightly p-doped.

FIG. 2N shows the structure after a step of depositing a polysilicon layer 42. The polysilicon layer 42 covers the pad oxide layer 22 (over the epitaxial silicon layer 10) and the epitaxial silicon 40 in the trench 16. The polysilicon layer 42 can prevent the pad oxide layer 22 from being exposed during CMP, and can help to protect the pad oxide 22 in order to provide improved uniformity and less CMP dishing. The polysilicon layer 42 may have a thickness of about 700 nm.

FIG. 2O shows the substrate 4 after removing the polysilicon layer 42 and a step of chemical mechanical planarization (CMP). The step of CMP levels the surface of the epitaxial silicon 40 in the trench 16. The upper surface of the silicon 16 is substantially level with the pad oxide layer 22 on either side.

FIG. 2P shows the substrate 4 after thermally growing a pad oxide layer 44 on the epitaxial silicon 40 in the trench 16, followed by deposition of a pad nitride layer 46. An oxide wet etch may be applied before the step of thermally growing the pad oxide layer 44. After one or more of the previous steps (e.g. wet etching and CMP), the pad oxide 22 may have been impacted and the thickness may no longer be controlled. By redoing a sacrificial oxidation on the whole wafer and then removing both the sacrificial oxide and the old pad oxide 22, the pad oxide can be redone with controlled thickness. In this case the original pad oxide layer 22 acts as a sacrificial layer to protect active region 10 during the fabrication process.

FIG. 2Q shows the substrate 4 after a step of patterning with a (third) photoresist 48 and opening the nitride layer 46 (hard mask open). The pad oxide layer 44 covers a central part of the epitaxial silicon 40 in the trench 16. The photoresist 48 is patterned to define device regions in the substrate 4. The pad oxide layer 44 covers an area of the epitaxial silicon 40, where a BJT is going to be formed. The pad oxide layer 22 left over the epitaxial silicon layer 10 may define regions for forming CMOS devices over the BOX layer 8.

FIG. 2R shows the substrate 4 after stripping the photoresist 48 and performing a shallow trench isolation (STI) etch to form trenches 50 and 52 in the epitaxial silicon 40 and in the epitaxial silicon layer 10 respectively.

FIG. 2S shows the semiconductor structure 2 after a number of further process steps. The further process steps comprise pullback, liner oxidation, high density plasma deposition (HDP), CMP direct, CMP touch-up, deglaze (wet and dry), and pad nitride strip to remove the nitride layer 46. For example, the method may comprise one or more of the following steps: nitride pullback (a quick nitride WET etch, to shorten the nitride and expose the silicon for better corner rounding), liner oxidation (a thin oxide formation covering the silicon everywhere to avoid voids), HDP deposition (to completely fill the STI trench with oxide), CMP direct and touch-up (to polish most of the HDP oxide and smooth the surface, and then change to another slurry and continue polishing slowly until touch up the nitride layer), deglaze wet (chemically remove oxide residual on top of the nitride) and dry etching oxide (further remove oxide and lower the height with respect to the nitride level, and thereby avoid an oxide level too high for post nitride stripping), and pad nitride strip (chemically remove all nitride layer). The semiconductor structure 2 may comprise a BJT in the epitaxial silicon 40 in the bulk region 17 and CMOS devices in the epitaxial silicon layer 10 over the BOX layer 8.

Figure 3:
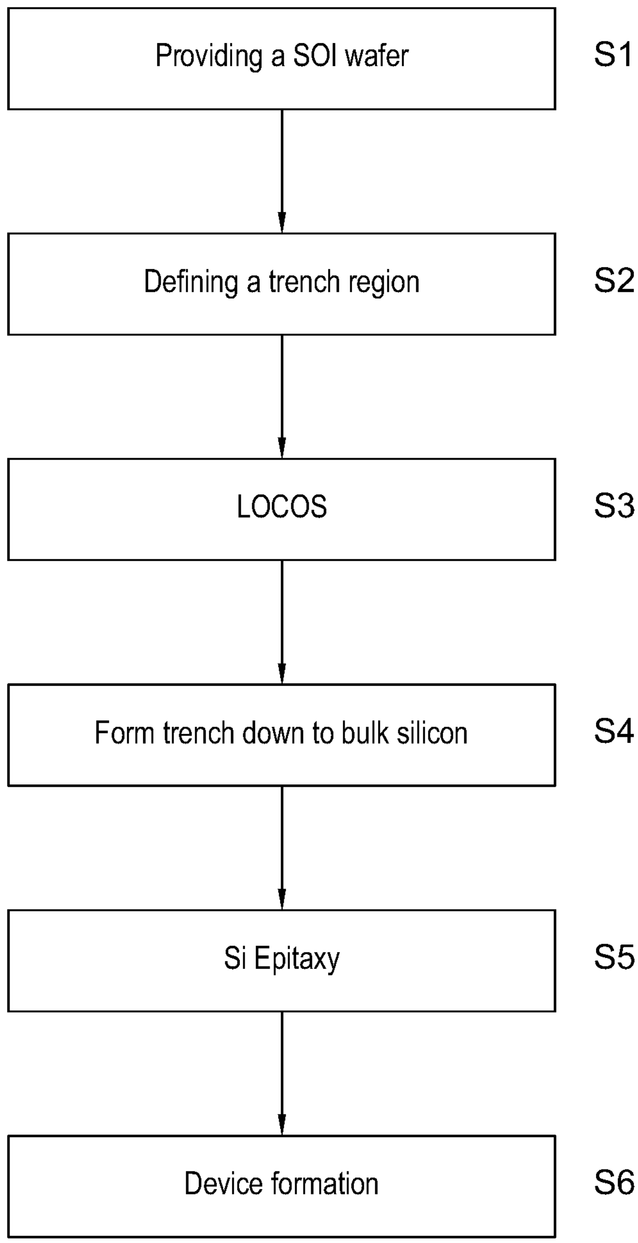
FIG. 3 shows a flow diagram illustrating the steps of a method of forming a semiconductor structure according to an embodiment.

FIG. 3 is a flow diagram illustrating at least some steps of a method of forming a semiconductor structure according to an embodiment. The method comprises providing a SOI wafer (step S1) comprising bulk silicon (handling wafer), a BOX layer and an epitaxial silicon layer (active layer), defining a trench region in the SOI wafer (step S2), performing a LOCOS process to form an oxide layer in the trench region (step S3), and forming a trench in the trench region down to the bulk silicon (handling wafer) of the SOI substrate (S4). The step of forming the trench (S4) may comprise a dry etch followed by a wet etch using a nitride hard mask. The step of forming the trench may further comprise performing a second LOCOS process. Using one or more further LOCOS processes allows the entire thickness of the epitaxial silicon layer to be oxidized down to the BOX layer. After forming the trench, the method comprises silicon epitaxy (step S5) to form a substantially monocrystalline silicon layer in the trench. The monocrystalline silicon layer is formed directly on the bulk silicon at the bottom of the trench. The method then comprises a step of device formation (step S6) to form one or more semiconductor devices in the monocrystalline silicon layer and in the remaining active layer on either side of the trench. For example, a BJT may be formed in the monocrystalline silicon layer. The step of device formation (step S5) typically comprises STI to provide further lateral isolation between devices.

In general, embodiments of the present disclosure provide a method of making a semiconductor structure. The method comprises providing a silicon on insulator (SOI) substrate (sometimes also referred to as a wafer) comprising a first epitaxial layer (e.g. substantially monocrystalline silicon) and a bulk silicon substrate (also referred to as "handling wafer") separated by a buried oxide layer, and performing a local oxidation of silicon (LOCOS) process in a region of the SOI substrate to at least partially oxidize the first epitaxial silicon layer in the region. The method further comprises locally etching the SOI substrate in the region to create a trench through the buried oxide layer and to the bulk silicon substrate, forming a second epitaxial layer on the bulk silicon substrate in the trench (the region may be referred to as the "bulk region," as it is where the buried oxide has been removed and replaced with silicon all the way down to the bulk silicon), and forming one or more semiconductor devices in the first and second epitaxial layers. The semiconductor devices may comprise transistors, diodes, well resistors etc. For example, the semiconductor structure may comprise a bipolar junction transistor (BJT) such as a heterojunction bipolar junction transistor (HBT) in the bulk region and 1.2 V or other CMOS devices in an adjacent region separated from the bulk region by STI.

The step of forming one or more semiconductor devices may comprise forming a silicon germanium (SiGe) device, such as a SiGe BJT, in or on the second epitaxial layer. The second epitaxial silicon layer may be formed by selective SiGe epitaxy in the gas environment Germane, Silane and Hydrogen. The step of forming one or more semiconductor devices may further comprise forming one or more CMOS devices in the first epitaxial layer located over the buried oxide layer. For example, a region immediately adjacent to the bulk region may comprise 1.2 V or other CMOS devices and a further region may comprise higher volt CMOS devices.

The method may comprise a second LOCOS process to fully oxidize the first epitaxial silicon layer in the region. If the first LOCOS process only partly oxidizes the first epitaxial layer in the region (i.e. the first epitaxial layer is only thinned down), then a further LOCOS process may be used in order to fully oxidize the first epitaxial layer in the region. The first epitaxial layer is still located on either side of the bulk region, within which semiconductor devices may be formed over the BOX layer. Due to the LOCOS process, the first epitaxial layer may be tapered (sloping down) towards the bulk region.

LOCOS is a conventional method that has largely been replaced by shallow trench isolation (STI) for providing lateral isolation of semiconductor devices. To facilitate the or each locos process the method may comprise one or more of the following steps in the following order:

- depositing a nitride hard mask layer on the substrate;
- depositing an oxide layer on the substrate (e.g. on top of the hard mask);
- depositing a photoresist on the substrate (e.g. on top of the deposited oxide), and patterning the photoresist to define the region. The second LOCOS process may use a nitride hard mask layer that was previously deposited and opened in order to perform the first LOCOS process. A LOCOS process can be used to provide a high quality oxide that is thermally grown. Compared to STI oxide, LOCOS oxide has better resistance during chemical etching, which can better and more precisely define a HBT region. For a specific design, the LOCOS process can allow smaller and narrower design rules.

When the first LOCOS process partially oxidized the first epitaxial layer in the region, and thereby forms an oxide layer on the first epitaxial layer in the region, the method may further comprise etching the region to remove the oxide layer on the first epitaxial layer to expose the first epitaxial layer in the region. For example, a wet etch may be used to expose the first epitaxial layer in the bulk region.

The method may further comprise, after the or each LOCOS process, depositing a nitride hard mask layer and a photoresist on the substrate, and patterning the nitride hard mask and the photoresist to define a trench region in the region. The step of locally etching may comprise a dry etch in the trench region to etch through a part but not through the whole of the buried oxide layer. That is the etch goes down through part of the depth/thickness of the BOX layer but not all the way down/through to the bulk silicon substrate. The BOX layer on either side of the trench region is not removed. The step of locally etching may further comprise a wet etch to etch through a remaining part of the buried oxide layer in the trench region to expose the bulk silicon substrate.

The step of forming a second epitaxial layer may comprise forming the second epitaxial layer to have a thickness greater than a combined thickness of the buried oxide layer and the first epitaxial layer. After forming the second epitaxial layer, chemical mechanical planarization (CMP) can be used to level an upper surface of the second epitaxial layer.

The method may further comprise shallow trench isolation (STI) to provide (further) lateral isolation at least between the first and second epitaxial layers.

The step of forming one or more semiconductor devices typically comprises selectively doping the first and second epitaxial layers. For example, p-doping and n-doping can be used to form BJT in the bulk region.

While specific embodiment have been described above, the skilled person will appreciate that further embodiments falling within the scope of the claims are possible. The features of any one embodiment may be suitably combined with those of one or more other embodiments.

What is claimed is:

1. A method of making a semiconductor structure, the method comprising:

providing a silicon on insulator (SOI) substrate comprising a first epitaxial layer and a bulk silicon substrate separated by a buried oxide layer;

performing one or more local oxidation of silicon (LOCOS) processes in a region of said SOI substrate to oxidize said first epitaxial silicon layer in said region and thereby form a second oxide layer on said buried oxide layer;

locally etching the SOI substrate in said region to create a trench through said second oxide layer and said buried oxide layer and to said bulk silicon substrate;

forming a second epitaxial layer on said bulk silicon substrate in said trench wherein said second epitaxial layer is isolated from said first epitaxial silicon layer by said second oxide layer; and forming one or more semiconductor devices in said first and second epitaxial layers.

2. A method according to claim 1, wherein said step of forming one or more semiconductor devices comprises forming a SiGe device in said second epitaxial layer.

3. A method according to claim 1, wherein said step of forming one or more semiconductor devices comprises forming a bipolar junction transistor (BJT) in said second epitaxial layer.

4. A method according to claim 1, wherein said step of forming one or more semiconductor devices comprises forming one or more CMOS devices in said first epitaxial layer located over said buried oxide layer.

5. A method according to claim 1, further comprising performing a second LOCOS process to fully oxidize said first epitaxial silicon layer in said region.

6. A method according to claim 1, wherein the or each locos process comprises one or more of the following steps in the following order:

depositing a nitride hard mask layer on said substrate;

depositing an oxide layer on said substrate;

depositing a photoresist on said substrate, and patterning said photoresist to define said region.

7. A method according to claim 1, wherein said LOCOS process partially oxidizes said first epitaxial layer in said region and thereby forms an oxide layer on said first epitaxial layer in said region, the method further comprising etching said region to remove said oxide layer on said first epitaxial layer to expose said first epitaxial layer in said region.

8. A method according to claim 1, further comprising, after the or each LOCOS process, depositing a nitride hard mask layer and a photoresist on said substrate, and patterning said nitride hard mask and said photoresist to define a trench region in said region.

9. A method according to claim 8, wherein said step of locally etching comprises performing a dry etch in said trench region to etch through a part but not through the whole of said buried oxide layer.

10. A method according to claim 9, wherein said step of locally etching comprises a wet etch to etch through a remaining part of said buried oxide layer in said trench region to expose said bulk silicon substrate.

11. A method according to claim 1, wherein said step of forming a second epitaxial layer comprises forming said second epitaxial layer to have a thickness greater than a combined thickness of said buried oxide layer and said first epitaxial layer.

12. A method according to claim 1, further comprising, after forming said second epitaxial layer, performing chemical mechanical planarization (CMP) to level an upper surface of said second epitaxial layer.

13. A method according to claim 1, further comprising providing shallow trench isolation (STI) to provide lateral isolation at least between said first and second epitaxial layers.

14. A method according to claim 1, wherein said step of forming one or more semiconductor devices comprises selectively doping said first and second epitaxial layers.

* * * * *